US010392559B2

(12) United States Patent
Jang et al.

(10) Patent No.: US 10,392,559 B2
(45) Date of Patent: Aug. 27, 2019

(54) PREPARATION METHOD OF NANOCRYSTALS COATED WITH METAL-SURFACTANT LAYERS

(75) Inventors: Eun Joo Jang, Suwon-si (KR); Sang Wook Kim, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 650 days.

(21) Appl. No.: 12/611,555

(22) Filed: Nov. 3, 2009

(65) Prior Publication Data

US 2010/0159249 A1 Jun. 24, 2010

(30) Foreign Application Priority Data

Dec. 19, 2008 (KR) ........................ 10-2008-0130499

(51) Int. Cl.
*B82Y 20/00* (2011.01)
*C09K 11/70* (2006.01)
*B82Y 30/00* (2011.01)
*H05B 33/14* (2006.01)
*H01L 51/50* (2006.01)

(52) U.S. Cl.
CPC .............. *C09K 11/70* (2013.01); *B82Y 20/00* (2013.01); *B82Y 30/00* (2013.01); *H05B 33/14* (2013.01); *H01L 51/5012* (2013.01); *Y10T 428/2991* (2015.01)

(58) Field of Classification Search
CPC ...................................................... C09K 11/70
USPC .......................................................... 427/215
See application file for complete search history.

(56) References Cited

U.S. PATENT DOCUMENTS

| | | | |
|---|---|---|---|
| 5,505,928 | A | 4/1996 | Alivisatos et al. |
| 6,872,249 | B2 | 3/2005 | Peng et al. |
| 7,105,051 | B2 | 9/2006 | Peng et al. |
| 7,253,119 | B2 | 8/2007 | Dutta |
| 7,399,429 | B2 | 7/2008 | Liu et al. |
| 7,468,168 | B2 | 12/2008 | Jang et al. |
| 7,621,997 | B2 | 11/2009 | Jun et al. |

(Continued)

FOREIGN PATENT DOCUMENTS

| | | |
|---|---|---|
| JP | 2003-064278 | 3/2003 |
| JP | 2008-520799 | 6/2008 |

(Continued)

OTHER PUBLICATIONS

Borchert, Investigation of ZnS Passivated InP Nanocrystals by XPS, Nano Letters, 2002, vol. 2 No. 2, p. 151-154.*

(Continued)

*Primary Examiner* — Tabatha L Penny
(74) *Attorney, Agent, or Firm* — Cantor Colburn LLP

(57) ABSTRACT

A method for preparing nanocrystals is disclosed. The method includes synthesizing colloidal semiconductor nanocrystal cores, and adding a metal salt to the colloidal semiconductor nanocrystal cores and heating the mixture while maintaining the reaction temperature constant. During the reaction, the surfaces of the semiconductor nanocrystal cores are etched ('in-situ etching') and metal-surfactant layers are formed on the etched surface portions of the semiconductor nanocrystal cores. The metal-surfactant layers are derived from the metal salt. Nanocrystals prepared by the method have minimal surface defects and exhibit high luminescence efficiency and good stability.

8 Claims, 5 Drawing Sheets

(56) References Cited

U.S. PATENT DOCUMENTS

| | | | | |
|---|---|---|---|---|
| 2005/0129947 | A1 | 6/2005 | Peng et al. | |
| 2005/0266246 | A1* | 12/2005 | Reiss et al. | 428/403 |
| 2006/0001119 | A1* | 1/2006 | Liu et al. | 257/442 |
| 2006/0157720 | A1 | 7/2006 | Bawendi et al. | |
| 2007/0151597 | A1 | 7/2007 | Chen et al. | |

FOREIGN PATENT DOCUMENTS

| | | | |
|---|---|---|---|
| KR | 100621308 | B | 9/2006 |
| KR | 1020070029915 | A | 3/2007 |
| KR | 100841186 | B1 | 6/2008 |

OTHER PUBLICATIONS

Haubold, Strongly Luminescent InP/ZnS Core-Shell Nanoparticles, ChemPhysChem, 2001, p. 331-334.*

Jun, Synthesis of multi-shell nanocrystals by a single step coating process, Nanotechnology, 17 (2006), p. 3892-3896.*

Guzelain, Synthesis of Size-Selected, Surface-Passivated InP Nanocrystals, J. Phys. Chem. 1996, 100, p. 7212-7219.*

Prasad, Paras N., Nanophotonics, John Wiley and Sons, 2004, p. 188.*

Bob C. Fitzmorris et al., "Synthesis and Structural, Optical, and Dynamic Properties of Core/Shell/Shell CdSe/ZnSe/ZnS Quantum Dots," The Journal of Physical Chemistry C, vol. 116, Nov. 5, 2012, 25065-25073.

Jang, et al.; KR10-2008-0130499; Preparation Method of Nanocrystal Passivated Metal-Surfactants Shells; Office Action dated Jul. 30, 2014; 3 pages.

Tessier, et al., "Economic and Size-Tunable Synthesis of InP/ZnE (E=S, Se) Colloidal Quantum Dots.", Chemisty of Materials, Jun. 11, 2015, pp. 4893-4898, American Chemical Society, Washington, DC. DOI: 10.1021/acs.chemmater.5b02138.

* cited by examiner

PREPARATION METHOD OF NANOCRYSTALS COATED WITH METAL-SURFACTANT LAYERS

CROSS-REFERENCE TO RELATED APPLICATION

This application claims priority to Korean Patent Application No. 10-2008-130499, filed on Dec. 19, 2008, and all the benefits accruing therefrom under 35 U.S.C. § 119, the contents of which in its entirety are herein incorporated by reference.

BACKGROUND

1. Field

The disclosure is directed to a method for preparing nanocrystals coated with metal-surfactant layers. More specifically, the method is directed to the preparation of nanocrystals with minimal surface defects, high luminescence efficiency and good stability.

2. Description of the Related Art

A semiconductor nanocrystal, also called a "quantum dot," is a crystalline semiconductor material of the size of a few nanometers and consists of several hundred to several thousand atoms. A semiconductor nanocrystal has a large surface area per unit volume and exhibits a variety of effects (e.g., quantum confinement) that are different from those exhibited by a bulk material having the same composition. These effects are due to its small size. These structural characteristics and effects account for unique physicochemical properties of the semiconductor nanocrystal different from those inherent to the constituent semiconductor materials. Particularly, the photoelectronic properties of nanocrystals can be controlled by varying the size of the nanocrystals. Research efforts are directed toward the development of nanocrystals applicable to a variety of display devices, including bioluminescent display devices.

However, since the surfaces of semiconductor nanocrystals are prone to oxidation, surface defects are likely to be caused. As a result, the luminescence efficiency of the semiconductor nanocrystals is liable to deteriorate and the core-shell structure of the semiconductor nanocrystals is destroyed.

In attempts to solve such problems, etchants have been used to remove surface defects of nanocrystals. However, etchants (e.g., HF) remove large amounts of organic materials present on the surfaces of nanocrystals rather than defects, making the nanocrystals unstable.

SUMMARY

Disclosed herein is a method for preparing nanocrystals, which includes synthesizing colloidal semiconductor nanocrystal cores; and adding a metal salt to the colloidal semiconductor nanocrystal cores and heating the mixture while maintaining the reaction temperature constant; etching the surfaces of the semiconductor nanocrystal cores to form etched surface portions of the semiconductor nanocrystal cores; and forming metal-surfactant layers derived from the metal salt as shells on the etched surface portions of the semiconductor nanocrystal cores.

In one exemplary embodiment, the method may further include adding an organic ligand to the nanocrystals coated with the metal-surfactant layers to replace the metal-surfactant layers with metal-organic ligand layers, the organic ligand being represented by Formula 1:

$$X—R—Y \quad (1)$$

wherein R is a hydrocarbon compound selected from the group consisting of monomeric, oligomeric and polymeric hydrocarbons, X is selected from the group consisting of SH, P, P═O, $NH_2$ and COOH, and Y is selected from the group consisting of OH, N, $NH_2$, COOH and $SO_3^-$.

Disclosed herein too are nanocrystals prepared by the method disclosed herein.

Disclosed herein too is a color filter that includes the nanocrystals.

Disclosed herein too is a display device that includes the nanocrystals as luminescent materials.

BRIEF DESCRIPTION OF THE DRAWINGS

The above and other aspects, advantages, and features of the invention will become more apparent by describing in further detail exemplary embodiments thereof with reference to the attached drawings in which.

DETAILED DESCRIPTION

Figure 1:
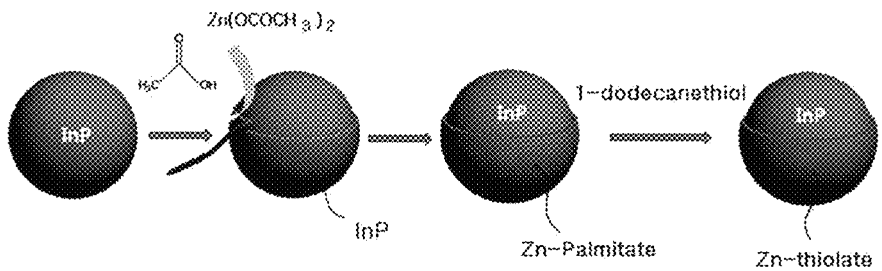
FIG. 1 is an exemplary conceptual diagram illustrating one method for preparing the nanocrystals.

Exemplary embodiments will now be described in greater detail hereinafter with reference to the accompanying drawings, in which embodiments of the invention are shown. These exemplary embodiments may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on, the other element or intervening elements may be present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The term "coat" as used herein means that a material is completely surrounded by another material to form a core-shell structure.

According to one exemplary embodiment, there is provided a method for preparing nanocrystals, which includes synthesizing colloidal semiconductor nanocrystal cores; and adding a metal salt to the colloidal semiconductor nanocrystal cores and heating the mixture while maintaining the reaction temperature constant to etch the surfaces of the semiconductor nanocrystal cores and form metal-surfactant layers derived from the metal salt on the etched surface portions of the semiconductor nanocrystal cores.

The individual steps of the method will be described in detail below.

First, colloidal semiconductor nanocrystals are synthesized. In one exemplary embodiment, the colloidal semiconductor nanocrystals may be synthesized by mixing an organic solvent, a surfactant and a first precursor together to form a mixture, heating the mixture and adding a second precursor to the mixture while maintaining the reaction temperature constant. The mixing of the organic solvent, the surfactant and the first precursor may be carried out by any general method. For example, the first precursor may be added to the organic solvent and the surfactant, or the organic solvent, the surfactant and the first precursor may be mixed together all at once. The first precursor is generally added prior to the second precursor. In such cases, the first precursor is termed the "former precursor", while the second precursor is termed the "latter precursor" respectively.

Examples of the organic solvent include $C_6$-$C_{24}$ primary alkylamines, $C_6$-$C_{24}$ secondary alkylamines, $C_6$-$C_{24}$ tertiary alkylamines, $C_6$-$C_{24}$ primary alcohols, $C_6$-$C_{24}$ secondary alcohols, $C_6$-$C_{24}$ tertiary alcohols, $C_6$-$C_{24}$ ketones, $C_6$-$C_{24}$ esters, $C_6$-$C_{24}$ heterocyclic compounds containing at least one heteroatom selected from nitrogen and sulfur atoms, $C_6$-$C_{24}$ alkanes, $C_6$-$C_{24}$ alkenes, $C_6$-$C_{24}$ alkynes, $C_6$-$C_{24}$ trialkyl phosphines such as trioctyl phosphine, and $C_6$-$C_{24}$ trialkyl phosphine oxides such as trioctyl phosphine oxide, or a combination comprising at least one of the foregoing organic solvents.

Examples of the surfactant include $C_6$-$C_{24}$ alkanes and alkenes having at least one terminal —COOH group, $C_6$-$C_{24}$ alkanes and alkenes having at least one terminal —POOH group, $C_6$-$C_{24}$ alkanes and alkenes having at least one terminal —SOOH group, and $C_6$-$C_{24}$ alkanes and alkenes having at least one terminal —$NH_2$ group. The surfactant may be oleic acid, stearic acid, palmitic acid, hexyl phosphonic acid, n-octyl phosphonic acid, tetradecyl phosphonic acid, octadecyl phosphonic acid, n-octylamine, hexadecyl amine, or a combination comprising at least one of the foregoing surfactants.

In one exemplary embodiment, the former (first) precursor may be a precursor of a Group II element such as zinc (Zn), cadmium (Cd) or mercury (Hg), a precursor of a Group III element such as aluminum (Al), gallium (Ga), indium (In) or titanium (Ti), or a precursor of a Group IV element such as silicon (Si), germanium (Ge), tin (Sn) or lead (Pb), and the latter (second) precursor may be a precursor of a Group V element such as P, arsenic (As), antimony (Sb) or bismuth (Bi), or a precursor of a Group VI element such as oxygen (O), sulfur (S), selenium (Se) or tellurium (Te). Each of the former (first) and latter (second) precursors is in the form of a salt, such as a carboxylate, carbonate, halide, nitrate, phosphate or sulfate of the corresponding element. In one exemplary embodiment, the semiconductor nanocrystal cores may be composed of a semiconductor selected from the group consisting of Group II-VI semiconductors, Group III-V semiconductors, Group IV semiconductors and Group IV-VI semiconductors. The Group II-VI semiconductors are reaction products of the Group II element precursor and the Group VI element precursor; the Group III-V semiconductors are reaction products of the Group III element precursor and the Group V element precursor; and the Group IV-VI semiconductors are reaction products of the Group IV element precursor and the Group VI element precursor.

The mixture is maintained under vacuum at 100° C. or above for about 1 to about 3 hours to remove a small amount of water and impurities contained therein. Then, the mixture is heated in an inert atmosphere and the latter (second) precursor is added thereto to react with the cationic precursor for a given time of at least one minute while maintaining the reaction temperature constant. In one exemplary embodiment, the reaction temperature may be about 100 to about 350° C. The reaction temperature is determined depending on the characteristics of the reactants. Thereafter, the reaction mixture is cooled to room temperature to precipitate the semiconductor nanocrystals in a colloidal state.

Then, a metal salt is added to the colloidal semiconductor nanocrystal cores and heated to maintain the reaction temperature constant.

In one exemplary embodiment, the metal salt may be a salt of a metal selected from the group consisting of magnesium (Mg), aluminum (Al), titanium (Ti), chromium (Cr), iron (Fe), cobalt (Co), nickel (Ni), copper (Copper), zinc (Zn), zirconium (Zr), niobium (Nb), molybdenum (Mo), tin (Sn), hafnium (Hf) and tungsten (W).

Any metal salt that is capable of being ionized to generate an organic or inorganic acid may be used without any limitation. The metal salt may be an organic or inorganic acid salt containing one of the metals. In one exemplary embodiment, the metal salt may be a carboxylate, carbonate, halide, nitrate, phosphate or sulfate of the selected metal. For example, the carboxylate may be an acetate or propionate salt. The organic or inorganic acid salt can be decomposed to form a $C_1$-$C_{16}$ alkane or alkene having at least one terminal —COOH group.

In one exemplary embodiment, the metal salt may be used in an amount of about 0.1 to about 10 moles per 1 mole of the semiconductor nanocrystal cores. Within this range, the metal salt induces etching of the colloidal semiconductor nanocrystal cores to an appropriate depth and enables the preparation of core-shell nanocrystals including the semiconductor nanocrystal cores coated with stable metal-surfactant layers as shells.

The metal salt is added to the colloidal semiconductor nanocrystal cores at room temperature. In one exemplary embodiment, the mixture may be heated to maintain the reaction temperature at about 150 to 260° C. As a result of the reaction, the surfaces of the semiconductor nanocrystal cores are etched and metal-surfactant layers are formed on the etched surface portions of the semiconductor nanocrystal cores. The metal salt is decomposed to generate an acid during the reaction. The acid etches the surfaces of the semiconductor nanocrystal cores. Further, the metal derived from the metal salt is bonded to the free surfactant to participate in the formation of the metal-surfactant layers on the etched surface portions of the semiconductor nanocrystal cores or is bonded to the surfactant present on the surfaces of the colloidal semiconductor nanocrystals to form the metal-surfactant layers.

For example, indium phosphide (InP) may be used as a material for the semiconductor nanocrystal cores and zinc acetate may be used as the metal salt, as illustrated in FIG. 1. In this case, the zinc acetate is decomposed to generate acetic acid, which etches the surfaces of the InP nanocrystal cores to leave zinc palmitate on the etched surface portions. This in-situ etching process is advantageous in that the metal-surfactant layers may be formed while minimizing the number of surface defects in the semiconductor nanocrystal cores because the semiconductor nanocrystal cores susceptible to oxidation are not exposed to air.

The reaction may give core-shell nanocrystals in which the metal-surfactant layers are formed on the surfaces of the semiconductor nanocrystal cores. The core-shell semiconductor nanocrystals exhibit markedly improved luminescence efficiency, increased stability against oxidation in air and increased thermal stability when compared with semiconductor nanocrystals that have no metal-surfactant layers.

In one exemplary embodiment, the method may further include adding an organic ligand to the nanocrystals coated with the metal-surfactant layers to replace the metal-surfactant layers with metal-organic ligand layers, the organic ligand being represented by Formula 1:

$$X—R—Y \qquad (1)$$

wherein R is a hydrocarbon compound selected from the group consisting of monomeric, oligomeric, polymeric hydrocarbons, and combinations thereof, X is selected from the group consisting of SH, P, P═O, $NH_2$, COOH, and combinations thereof and Y is selected from the group consisting of H, OH, N, $NH_2$, COOH, $SO_3^-$, and combinations thereof.

The organic ligand replaces the surfactant of the metal-surfactant layers to form the metal-organic ligand layers. The metal-organic ligand layers are more strongly bound to the nanocrystal cores than the metal-surfactant layers thereby effectively reducing the number of defects in the semiconductor nanocrystal cores. This greatly increasing the efficiency and stability of the semiconductor nanocrystals.

For example, 1-dodecanethiol may be used as the organic ligand and may be added to the nanocrystals coated with zinc-palmitate, as illustrated in FIG. 1. In this case, the palmitate is replaced by the thiolate to form zinc-thiolate layers on the nanocrystal cores.

Examples of the organic ligand include thiols, such as methane thiol, ethane thiol, propane thiol, butane thiol, pentane thiol, hexane thiol, octane thiol, dodecane thiol, hexadecane thiol, octadecane thiol and benzyl thiol; mercapto-spacer-alcohols, such as mercaptomethanol, mercaptoethanol, mercaptopropanol, mercaptobutanol, mercaptopentanol and mercaptohexanol; mercapto-spacer-carboxylic acids, such as mercaptoacetic acid, mercaptopropionic acid, mercaptobutanoic acid, mercaptohexanoic acid and mercaptoheptanoic acid; mercapto-spacer-sulfonic acids, such as mercaptomethanesulfonic acid, mercaptoethanesulfonic acid, mercaptopropanesulfonic acid and mercaptobenzenesulfonic acid; mercapto-spacer-amines, such as mercaptomethylamine, mercaptoethylamine, mercaptopropylamine, mercaptobutylamine, mercaptopentylamine, mercaptohexylamine and mercaptopyridine; mercapto-spacer-thiols, such as mercaptomethanethiol, mercaptoethanethiol, mercaptopropanethiol, mercaptobutanethiol and mercaptopentanethiol; amines, such as methylamine, ethylamine, propylamine, butylamine, pentylamine, hexaylamine, octylamine, dodecylamine, hexadecyamine, octadecylamine, dimethylamine, diethylamine and dipyridylamine; amino-spacer-alcohols, such as aminomethanol, aminoethanol, aminopropanol, aminobutanol, aminopentanol and aminohexanol; amino-spacer-carboxylic acids, such as aminoacetic acid, aminopropionic acid, aminobutanoic acid, aminohexanoic acid and aminoheptanoic acid; amino-spacer-sulfonic acids, such as aminomethanesulfonic acid, aminoethanesulfonic acid, aminopropanesulfonic acid and aminobenzenesulfonic acid; amino-spacer-amines and diamines, such as aminomethylamine, aminoethylamine, aminopropylamine, aminopentylamine, aminohexylamine, aminobenzylamine and aminopyridine; carboxylic acids, such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid and benzoic acid; carboxylic acid-spacer-alcohols, such as carboxylic acid methanol, carboxylic acid ethanol, carboxylic acid propanol, carboxylic acid butanol, carboxylic acid pentanol and carboxylic acid hexanol; carboxylic acid-spacer-sulfonic acids, such as carboxylic acid methanesulfonic acid, carboxylic acid ethanesulfonic acid, carboxylic acid propanesulfonic acid and carboxylic acid benzenesulfonic acid; carboxylic acid-spacer-carboxylic acids, such as carboxylic acid methanecarboxylic acid, carboxylic acid ethanecarboxylic acid, carboxylic acid propanecarboxylic acid, carboxylic acid propanecarboxylic acid and carboxylic acid benzene carboxylic acid; phosphines, such as methyl phosphine, ethyl phosphine, propyl phosphine, butyl phosphine and pentyl phosphine; phosphine-spacer-alcohols, such as phosphine methanol, phosphine ethanol, phosphine propanol, phosphine butanol, phosphine pentanol and phosphine hexanol; phosphine-spacer-sulfonic acids, such as phosphine methanesulfonic acid, phosphine ethanesulfonic acid, phosphine propanesulfonic acid and phosphine benzenesulfonic acid; phosphine-spacer-carboxylic acids, such as phosphine methanecarboxylic acid, phosphine ethanecarboxylic acid, phosphine propanecarboxylic acid and phosphine benzenecarboxylic acid; phosphine-spacer-amines, such as phosphine methylamine, phosphine ethylamine, phosphine propylamine and phosphine benzylamine; phosphine oxides, such as methylphosphine oxide, ethylphosphine oxide, propylphosphine oxide and butylphosphine oxide; phosphine oxide alcohols, such as phosphine oxide methanol, phosphine oxide ethanol, phosphine oxide propanol, phosphine oxide butanol, phosphine oxide pentanol and phosphine oxide hexanol; phosphine oxide-spacer-sulfonic acids, such as phosphine oxide methanesulfonic acid, phosphine oxide ethanesulfonic acid, phosphine oxide propanesulfonic acid and phosphine oxide benzenesulfonic acid; phosphine oxide-spacer-carboxylic acids, such as phosphine oxide methanecarboxylic acid, phosphine oxide ethanecarboxylic acid, phosphine oxide propanecarboxylic acid and phosphine oxide benzene carboxylic acid; and phosphine oxide-spacer-amines, such as phosphine oxide methylamine, phosphine oxide ethylamine, phosphine oxide propylamine and phosphine oxide benzylamine.

Combinations of the one or more of the foregoing organic ligands may be used. Examples of the spacers include $C_1$-$C_{16}$ alkylenes and $C_6$-$C_{24}$ arylenes.

In accordance with one exemplary embodiment, there is provided a color filter including the semiconductor nanocrystals. Generally, a liquid crystal display ("LCD") includes color filters, each of which has a primary color of red, green or blue and is included in one pixel. The color filter may further include at least one material selected from pigments, photosensitive organic materials, inorganic materials, and the like. The color filter is in the form of a film and may be attached to a suitable position of a display. Alternatively, the color filter may be produced by coating a solution containing the semiconductor nanocrystals on a suitable position of a display. The coating may be performed by any coating process such as spin coating or spray coating. Methods for producing the color filter are widely known in the art, and thus their detailed description is omitted herein.

In accordance with another exemplary embodiment, there is provided a display device including the semiconductor nanocrystals as luminescent materials. The display device may be an organic light emitting diode ("OLED"). A general organic light emitting diode has a structure in which an organic emission layer is formed between two electrodes and utilizes the principle that electrons injected from one of the electrodes and holes injected from the other electrode combine together in the organic emission layer to form excitons, which decay from the excited state to the ground state to emit light.

Figure 2:
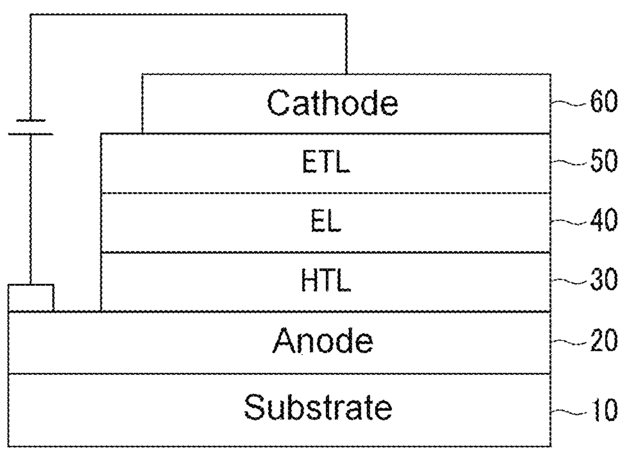
FIG. 2 is an exemplary schematic view illustrating a display device that includes the nanocrystals.

FIG. 2 illustrates an exemplary embodiment of the organic light emitting display device. In the display device, an anode 20 is disposed on an organic substrate 10. The anode 20 may be made of a high work function material to allow holes to be injected thereinto. For example, the anode material may be a transparent oxide such as indium tin oxide ("ITO") or indium oxide.

A hole transport layer ("HTL") 30, an emission layer ("EL") 40 and an electron transport layer ("ETL") 50 are sequentially formed on the anode 20. The hole transport layer 30 may contain a p-type semiconductor, and the electron transport layer 50 may contain an n-type semiconductor or a metal oxide. The emission layer 40 contains core-shell nanocrystals prepared by the method.

A cathode 60 is disposed on the electron transport layer 50. The cathode 60 may be made of a low work function material to facilitate the injection of electrons into electron transport layer ("ETL") 50. Examples of the cathode material include metals, such as magnesium, calcium, sodium, potassium, titanium, indium, yttrium, lithium, gadolinium, aluminum, silver, tin, lead, cesium, barium and alloys thereof; and multilayer materials, such as LiF/Al, $LiO_2$/Al, LiF/Ca, LiF/Al $BaF_2$/Ca, and combinations comprising at least one of the foregoing metals. Methods for the formation of the constituent electrodes and layers and methods for the fabrication of the display device are widely known in the art, and thus their detailed description is omitted herein.

A more detailed description of exemplary embodiments will be described with reference to the following examples. However, these examples are given merely for the purpose of illustration and are not to be construed as limiting the scope of the embodiments.

EXAMPLES

<Example 1> Preparation of InP/Zn-Palmitate Nanocrystals Emitting Light at 520 nm Indium acetate (0.04 millimolar ("mmol"), 11.34 milligrams ("mg")) is added to a mixture of palmitic acid (0.12 mmol, 30.77 mg) and octadecene (2 milliliters ("mL")), heated to 110° C., and maintained under vacuum for 1.5 hours to remove a small amount of water. The resulting mixture is heated to 300° C. under an argon atmosphere, and then a solution of trimethylsilyl-3-phosphine (0.02 mmol, 5 mg) in octadecene (3 mL) is added thereto. The reaction mixture is rapidly cooled to room temperature to give colloidal InP nanocrystals.

Figure 3:
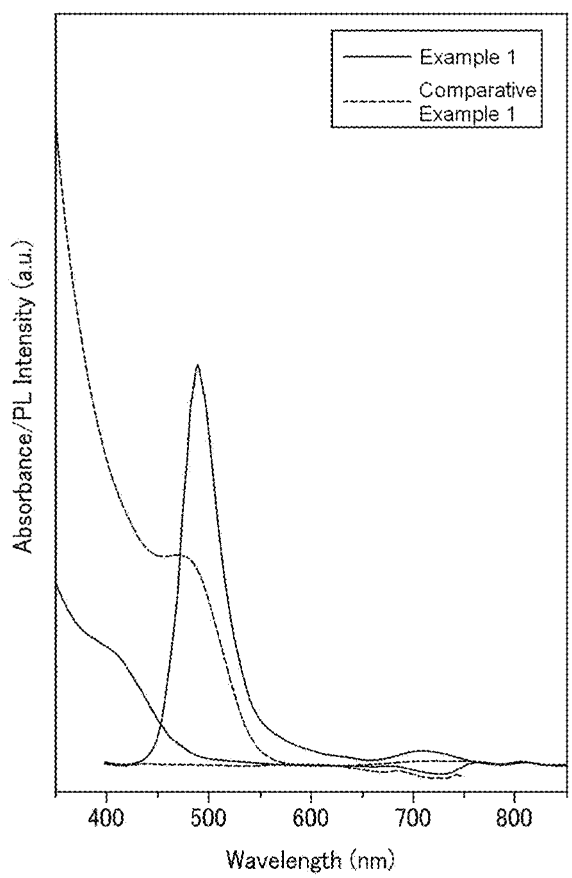
FIG. 3 is a graphical representation of absorption and emission spectra of InP/Zn-palmitate nanocrystals prepared in Example 1 and InP nanocrystals prepared in Comparative Example 1.

Zinc acetate (0.1 mmol, 18.35 mg) is added to the colloidal InP nanocrystals at room temperature and heated to 230° C. The growth of the InP nanocrystals is observed at intervals of 1 to 2 hours until the PL intensity increases. The mixture is cooled to room temperature to give colloidal InP core/Zn-palmitate shell nanocrystals. Then, the colloidal InP/Zn-palmitate nanocrystals are precipitated in isopropanol (40 mL). The precipitate is again dissolved in toluene to remove by-products. FIG. 3 shows that the InP/Zn-palmitate nanocrystals emit light at 520 nm.

Figure 4:
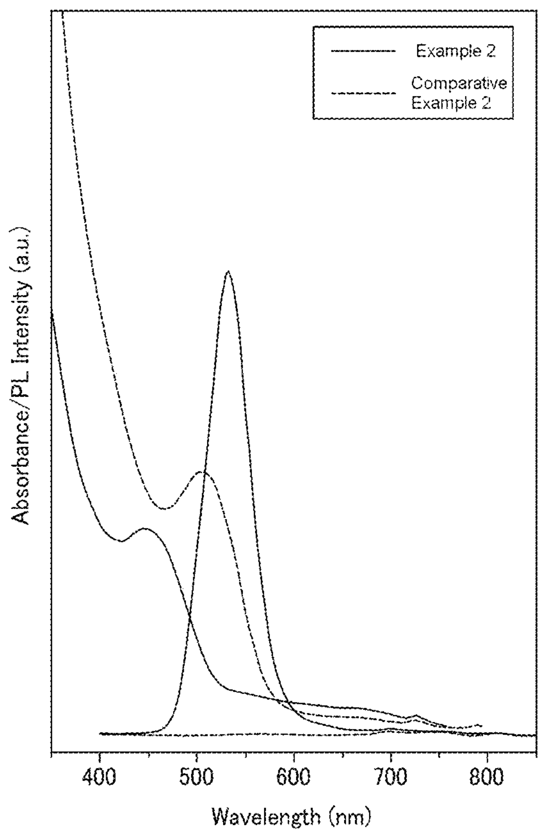
FIG. 4 is a graphical representation of absorption and emission spectra of InP/Zn-palmitate nanocrystals prepared in Example 2 and InP nanocrystals prepared in Comparative Example 2.

<Example 2> Preparation of InP/Zn-Palmitate Nanocrystals Emitting Light at 580 nm 0.12 mmol (34.034 mg) of indium acetate is added to a mixture of 0.36 mmol (92.31 mg) of palmitic acid and 2 mL of octadecene, heated to 110° C., and maintained under vacuum for 1.5 hours to remove a small amount of water. The resulting mixture is heated to 300° C. under an argon atmosphere, and then a solution of 0.06 mmol (15 mg) of trimethylsilyl-3-phosphine in 1 mL of octadecene is added thereto. The reaction mixture is heated to 270° C., maintained at 270° C. for 30 minutes, and rapidly cooled to room temperature to give colloidal InP nanocrystals. 0.30 mmol (55.04 mg) of zinc acetate is added to the colloidal InP nanocrystals at room temperature and heated to 230° C. The growth of the InP nanocrystals is observed at intervals of 3 to 4 hours until the PL intensity increases. The mixture is cooled to room temperature to give colloidal InP core/Zn-palmitate shell nanocrystals. Then, the colloidal InP/Zn-palmitate nanocrystals are precipitated in isopropanol (40 mL). The precipitate is again dissolved in toluene to remove by-products. FIG. 4 shows that the InP/Zn-palmitate nanocrystals emit light at 580 nm.

Figure 5:
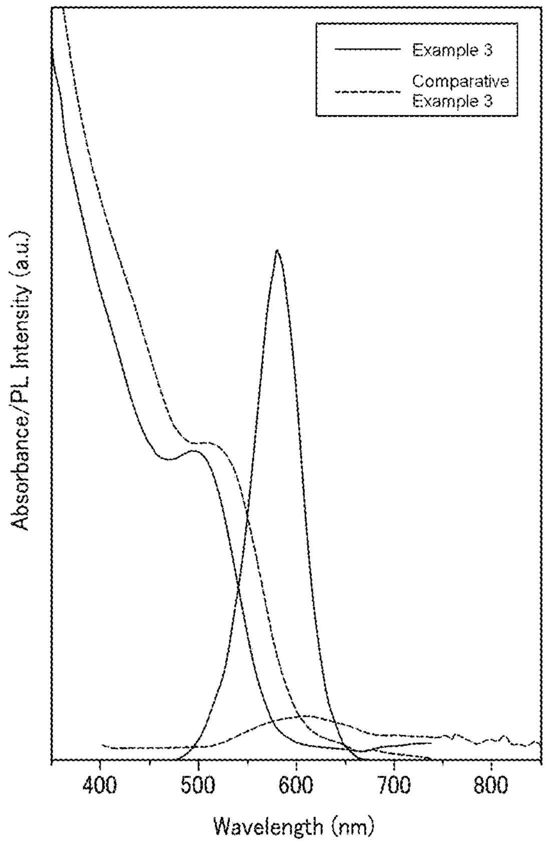
FIG. 5 is a graphical representation of absorption and emission spectra of InP/Zn-palmitate nanocrystals prepared in Example 3 and InP nanocrystals prepared in Comparative Example 3.

<Example 3> Preparation of InP/Zn-Palmitate Nanocrystals Emitting Light at 600 nm InP/Zn-palmitate nanocrystals are prepared in the same manner as in Example 2, except that 0.16 mmol (46.71 mg) of indium acetate is added to a mixture of 0.48 mmol (122.94 mg) of palmitic acid and 8 mL of octadecene, and 0.08 mmol (20 mg) of trimethylsilyl-3-phosphine is dissolved in 1 mL of octadecene. FIG. 5 shows that the InP/Zn-palmitate nanocrystals emit light at 600 nm.

<Example 4> Preparation of InP/Zn-Thiolate Nanocrystals

InP/Zn-thiolate nanocrystals are prepared in the same manner as in Example 2, except that the growth of the InP nanocrystals is observed at intervals of 1 to 2 hours until the PL intensity increases and 0.04 mmol (8.09 mg) of 1-dodecanethiol is injected to react with the InP/Zn-palmitate nanocrystals for one hour before cooling down to room temperature.

<Comparative Example 1> Preparation of InP Nanocrystals

Colloidal InP nanocrystals are prepared in the same manner as the preparation procedure described in Example 1.

<Comparative Example 2> Preparation of InP Nanocrystals

Colloidal InP nanocrystals are prepared in the same manner as the preparation procedure described in Example 2.

<Comparative Example 3> Preparation of InP Nanocrystals

Colloidal InP nanocrystals are prepared in the same manner as the preparation procedure described in Example 3.

Measurements of Absorption and Emission Spectra

The absorption and emission spectra of the colloidal InP core/Zn-palmitate shell nanocrystals prepared in Examples 1-3 and the colloidal InP nanocrystals prepared in Comparative Examples 1-3 are measured, and the results are shown in FIGS. 3 to 5.

FIG. 3 is a graph showing the results of Example 1 and Comparative Example 1. From the fact that the peak of the absorption spectrum of the InP/Zn-palmitate nanocrystals is shifted to a shorter wavelength, it can be seen that the radii of the InP nanocrystal cores of the InP/Zn-palmitate nanocrystals are smaller than those of the InP nanocrystals prepared in Comparative Example 1, indicating that the surfaces of the InP nanocrystal cores are etched.

Further, an increase in the luminescence efficiency of the InP/Zn-palmitate nanocrystals is supported by the fact that the InP/Zn-palmitate nanocrystals show a stronger peak at 520 nm whereas the InP nanocrystals show a weaker peak at 520 nm in the emission spectra.

FIG. 4 is a graph showing the results of Example 2 and Comparative Example 2. The explanation of FIG. 3 is applied to the emission spectra of FIG. 4 as well, except that the InP/Zn-palmitate nanocrystals show a strong peak at 580 nm in the emission spectrum.

FIG. 5 is a graph showing the results of Example 3 and Comparative Example 3. The explanation of FIG. 3 is applied to the emission spectra of FIG. 5 as well, except that the InP/Zn-palmitate nanocrystals show a strong peak at 600 nm in the emission spectrum.

Crystal Size Measurement

Figure 6:
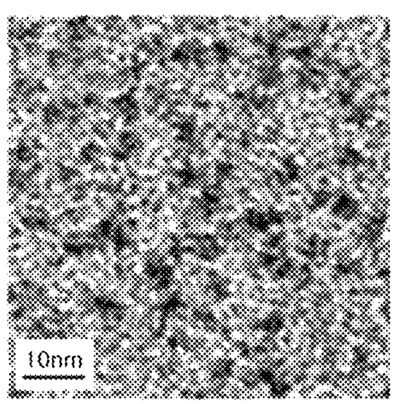
FIG. 6 is a transmission electron microscopy ("TEM") image of InP/Zn-thiolate nanocrystals prepared in Example 2.

FIG. 6 is a transmission electron microscopy ("TEM") image of the InP/Zn-palmitate nanocrystals prepared in Example 2. The image shows that the nanocrystals have a size of about 3.6 nm.

Stability Measurements

After the colloidal nanocrystals prepared in Examples 2 and 4 and Comparative Example 2 are allowed to stand in air, changes in quantum yield are observed.

Figure 7:
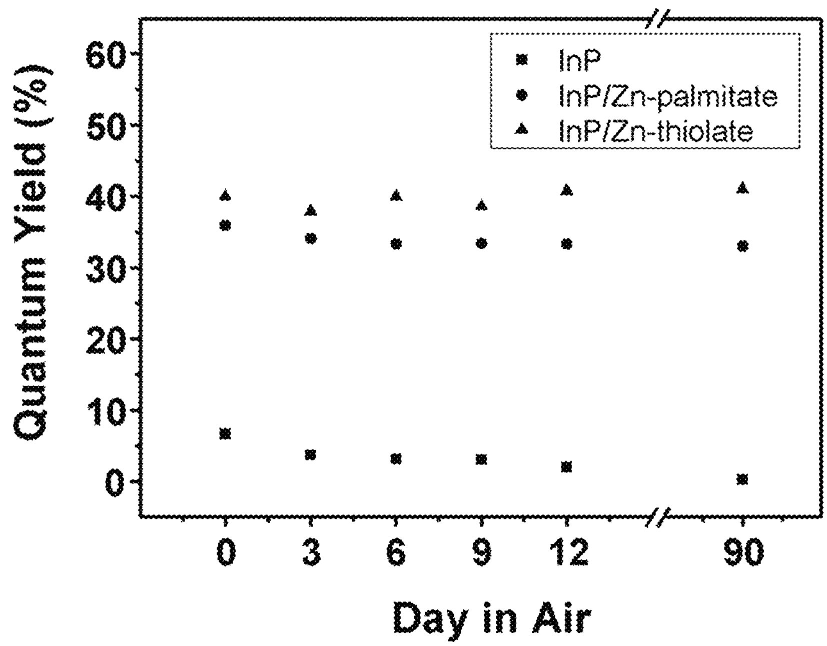
FIG. 7 is a graph comparing the oxidation stability of InP nanocrystals, InP/Zn-palmitate nanocrystals and InP/Zn-thiolate nanocrystals prepared in Comparative Example 2, Example 2 and Example 4, respectively.

FIG. 7 is a graph showing the oxidation stability of the colloidal nanocrystals prepared in Examples 2 and 4 and Comparative Example 2. The graph demonstrates that the formation of the Zn-palmitate layers (Example 2) or the binding of the thiol groups (Example 4) contributes to an improvement in oxidation stability.

Changes in the quantum yield of the colloidal nanocrystals prepared in Examples 2 and 4 and the Comparative Example 2 before and after heating are observed.

Figure 8:
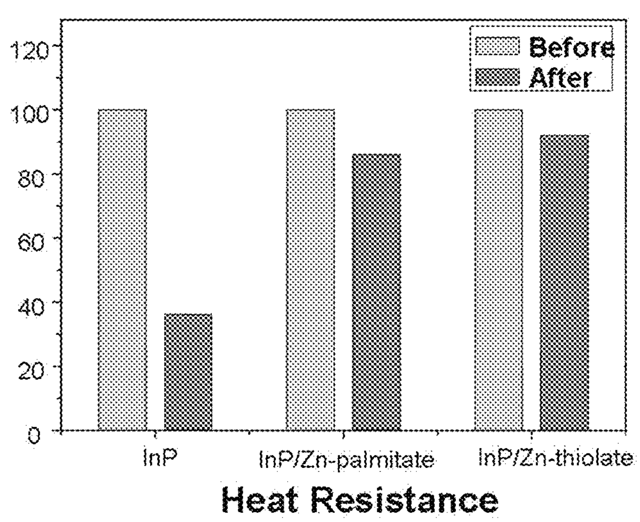
FIG. 8 is a graph comparing the thermal stability of InP nanocrystals, InP/Zn-palmitate nanocrystals and InP/Zn-thiolate nanocrystals prepared in Comparative Example 2, Example 2 and Example 4 respectively.

FIG. 8 is a graph showing the thermal stability of the colloidal nanocrystals prepared in Examples 2 and 4 and compared against the nanocrystals of the Comparative Example 2. The graph demonstrates that the formation of the Zn-palmitate layers (Example 2) or the binding of the thiol groups (Example 4) contributes to an improvement in thermal stability.

As is apparent from the foregoing, according to exemplary embodiments of the method, semiconductor nanocrystal cores are etched by an in-situ etching process and metal-surfactant layers are formed on the etched surface portions thereof. Nanocrystals prepared by the method have minimal surface defects and exhibit high luminescence efficiency and good stability.

Although exemplary embodiments have been described herein with reference to the foregoing embodiments, those skilled in the art will appreciate that various modifications and changes are possible without departing from the spirit of the invention as disclosed in the accompanying claims. Therefore, it is to be understood that such modifications and changes are encompassed within the scope of the invention.

What is claimed is:

1. A method for preparing nanocrystals, comprising synthesizing colloidal semiconductor nanocrystal cores in the presence of palmitic acid, wherein the semiconductor nanocrystal cores consist of InP;

adding zinc acetate to the colloidal semiconductor nanocrystal cores and heating the mixture while maintaining the reaction temperature constant to etch the surfaces of the semiconductor nanocrystal cores; and forming metal-surfactant layers derived from the zinc acetate and palmitic acid on the etched surface portions of the semiconductor nanocrystal cores.

2. The method of claim 1, wherein the method further comprising:

adding an organic ligand to the nanocrystal cores coated with the metal-surfactant layers to replace the metal-surfactant layers with metal-organic ligand layers; where the organic ligand being represented by Formula 1:

$$X—R—Y \quad (1)$$

wherein R is a carbon compound composed of carbon (C) and hydrogen (H), X is selected from the group consisting of SH, P, P═O, $NH_2$ and COOH, and Y is selected from the group consisting of H, OH, N, $NH_2$, COOH and $SO_3^-$.

3. The method of claim 1, wherein the zinc acetate is used in an amount of about 0.1 to about 5 moles per 1 mole of the semiconductor nanocrystal cores.

4. The method of claim 1, wherein the reaction temperature is between about 150° C. and 260° C.

5. The method of claim 1, wherein the synthesis of the colloidal semiconductor nanocrystals includes mixing an organic solvent, palmitic acid, and a cationic precursor, and heating the mixture and adding an anionic precursor to the mixture.

6. The method of claim 5, wherein heating the mixture and adding an anionic precursor to the mixture is performed while maintaining a temperature between about 100° C. and about 350° C.

7. The method of claim 5, wherein the cationic precursor is selected from indium element precursors; and the anionic precursor is selected from phosphorous element precursors.

8. The method of claim 1, wherein forming metal-surfactant layers derived from the zinc acetate and palmitic acid on the etched surface portions of the semiconductor nanocrystal cores are simultaneously performed with the etching the surfaces of the semiconductor nanocrystal cores.

* * * * *